United States Patent
Yun et al.

(10) Patent No.: US 9,370,103 B2
(45) Date of Patent: Jun. 14, 2016

(54) LOW PACKAGE PARASITIC INDUCTANCE USING A THRU-SUBSTRATE INTERPOSER

(71) Applicant: QUALCOMM Incorporated, San Diego, CA (US)

(72) Inventors: Changhan Hobie Yun, San Diego, CA (US); Chengjie Zuo, Santee, CA (US); Jonghae Kim, San Diego, CA (US); Daeik Daniel Kim, San Diego, CA (US); Mario Francisco Velez, San Diego, CA (US)

(73) Assignee: QUALCOMM Incorported, San Diego, CA (US)

( * ) Notice: Subject to any disclaimer, the term of this patent is extended or adjusted under 35 U.S.C. 154(b) by 245 days.

(21) Appl. No.: 14/020,558

(22) Filed: Sep. 6, 2013

(65) Prior Publication Data

US 2015/0070863 A1 Mar. 12, 2015

(51) Int. Cl.
*H05K 1/18* (2006.01)
*H05K 1/16* (2006.01)
*H05K 1/03* (2006.01)
*H05K 1/11* (2006.01)
*H05K 3/46* (2006.01)
*H01L 23/498* (2006.01)
*H01L 23/50* (2006.01)

(52) U.S. Cl.
CPC .......... *H05K 1/162* (2013.01); *H01L 23/49822* (2013.01); *H05K 1/032* (2013.01); *H05K 1/0306* (2013.01); *H05K 1/115* (2013.01); *H05K 1/181* (2013.01); *H05K 3/46* (2013.01); *H01L 23/50* (2013.01); *H01L 2224/16225* (2013.01); *H01L 2924/15311* (2013.01); *H05K 2201/10378* (2013.01); *H05K 2201/10674* (2013.01); *Y10T 29/49165* (2015.01)

(58) Field of Classification Search
CPC ............... H01L 2224/16225; H01L 23/49822; H01L 23/50; H01L 2924/15311; H05K 1/0306; H05K 1/032; H05K 1/115; H05K 1/162; H05K 1/181; H05K 2201/10378; H05K 2201/10674; H05K 3/46; Y10T 29/49165
USPC .............. 361/763, 767, 782, 783, 320, 321.2, 361/321.1; 174/260, 261, 262
See application file for complete search history.

(56) References Cited

U.S. PATENT DOCUMENTS 5,583,359 A * 12/1996 Ng ...................... H01L 23/5223
257/306
6,125,027 A * 9/2000 Klee .................... C03C 17/3417
361/306.1

(Continued)

FOREIGN PATENT DOCUMENTS

| DE | 10303738 A1 | 8/2004 |
| WO | 0191144 A1 | 11/2001 |
| WO | 2011129360 A1 | 10/2011 |

OTHER PUBLICATIONS

International Search Report and Written Opinion—PCT/US2014/053864—ISA/EPO—Jan. 21, 2015.

*Primary Examiner* — Yuriy Semenenko
(74) *Attorney, Agent, or Firm* — Muncy, Geissler, Olds & Lowe, P.C.

(57) ABSTRACT

An interposer for a chipset includes multilayer thin film capacitors incorporated therein to reduce parasitic inductance in the chipset. Power and ground terminals are laid out in a staggered pattern to cancel magnetic fields between conductive vias to reduce equivalent series inductance (ESL).

11 Claims, 8 Drawing Sheets

(56) References Cited

U.S. PATENT DOCUMENTS

| | | |
|---|---|---|
| 6,885,541 B2 | 4/2005 | Otsuka et al. |
| 7,081,650 B2 | 7/2006 | Palanduz et al. |
| 7,339,798 B2 | 3/2008 | Chakravorty |
| 7,583,511 B2 | 9/2009 | Cornelius |
| 8,062,968 B1 | 11/2011 | Conn |
| 2004/0264103 A1* | 12/2004 | Otsuka ............... H01G 2/065 361/306.1 |
| 2006/0245139 A1 | 11/2006 | Kariya |
| 2007/0035030 A1 | 2/2007 | Horton et al. |
| 2008/0316723 A1* | 12/2008 | Borland ............... H05K 1/162 361/763 |
| 2009/0231820 A1* | 9/2009 | Tanaka ............ H01L 23/49822 361/764 |
| 2011/0058348 A1* | 3/2011 | Sakai ............... H01L 23/481 361/803 |

\* cited by examiner

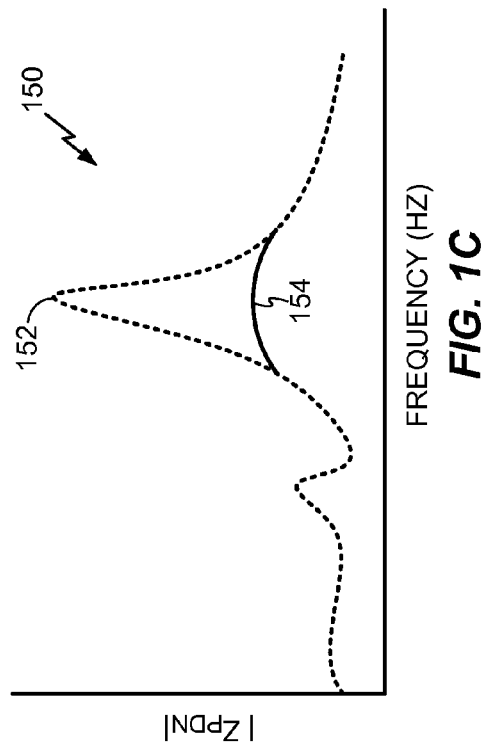
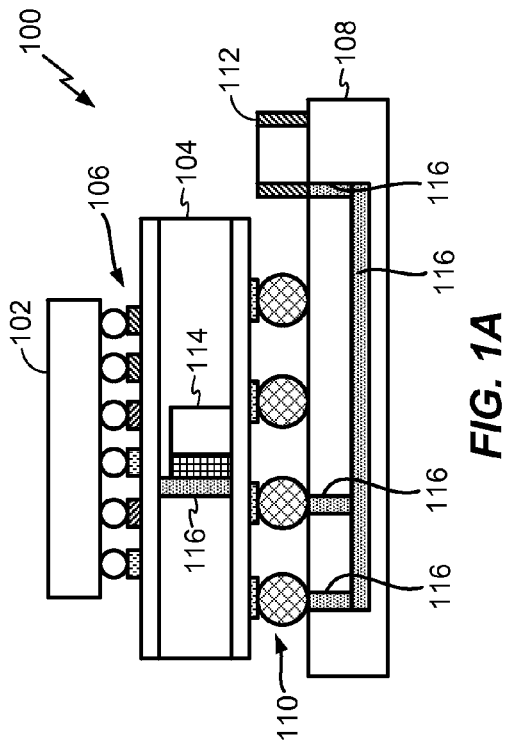
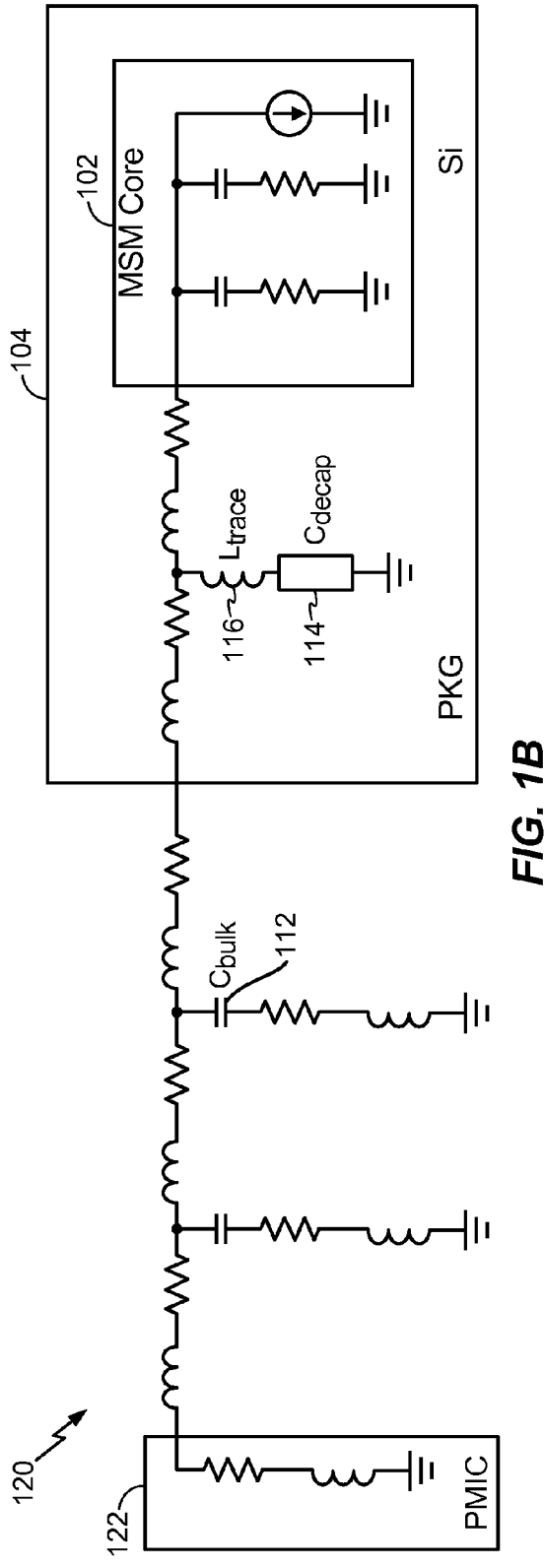

CANCELED MAGNETIC FIELD =

LOW PACKAGE PARASITIC INDUCTANCE USING A THRU-SUBSTRATE INTERPOSER

FIELD OF DISCLOSURE

Aspects of the present disclosure relate generally to semiconductor packaging, and in particular to semiconductor packaging that have low parasitic inductance and equivalent series inductance.

BACKGROUND

Integrated circuits (ICs) are fabricated on wafers. Commonly, these wafers are semiconductor materials, for example, silicon. Through efforts of research and development, the size of the transistors making up the ICs has decreased, and as a result voltage supplied to the transistors decreases.

An IC is commonly coupled to a voltage regulator that is part of a power delivery network for the IC. The voltage regulator converts power supply voltages to the lower voltages used by the IC. The voltage regulator ensures a predictable power supply is provided to the IC.

As transistors of the IC turn on and off, however, the load on the power supply changes rapidly, placing additional demand on the voltage regulator. The distance between the voltage regulator and the IC creates a long response time, preventing the voltage regulator from increasing power to the IC instantaneously, especially when the transistors switch on and off millions or billions of times each second. Decoupling capacitors provide additional stability to the power supplied to the ICs.

Decoupling capacitors attached in close proximity to the IC provide instantaneous current to the IC. As demand on the power supply changes rapidly, the capacitor provides additional power and can refill at a later time when the power demand decreases. The decoupling capacitor allows ICs to operate at the high frequencies and computational speeds desired by consumers. However, as the transistor sizes have decreased and transistor densities increased, finding area on the IC for decoupling capacitors has become difficult.

One configuration for decoupling the IC locates decoupling capacitors directly on the IC die. However, locating decoupling capacitors directly on the IC die occupies die area that could otherwise be used for active circuitry. Additionally, fabricating decoupling capacitors on the die involves additional manufacturing time that increases the cost of manufacturing.

As one example, a conventional decoupling capacitor used in ICs is a thin film capacitor. Thin film capacitors may be fabricated on the wafer at an additional cost during manufacturing. These capacitors are typically alternating layers of a dielectric material followed by a conductor. Although the thin film capacitor is a simple structure, the capacitance is determined largely by the number of series capacitances in parallel. As more capacitance is added, however, the thin film capacitor structure increases in height.

Metal-insulator-metal (MIM) capacitors may be manufactured to fit in smaller height constraints than thin film capacitors. When packaging the capacitors, height may be an important consideration. Furthermore, MIM capacitors offer additional flexibility over thin film capacitors in designing the equivalent series inductance (ESL) and equivalent series resistance (ESR) in the power delivery network.

As packages shrink in size to fit the smaller form factors present in mobile devices, for example, the space that is available on the package decreases. Additionally, as the circuits operate at higher frequencies, higher capacitances are required to ensure proper operation of the circuitry and transistors.

For example, as ICs operate at higher frequencies they are affected by the total characteristic impedance of the power delivery network. The total characteristic impedance is affected by the inductance of the traces in the decoupling capacitor (i.e., parasitic inductance) as well as the equivalent series inductance (ESL) of the decoupling capacitor. Parasitic inductance in traditional IC arrangements can be upwards of 100 pH or more while the equivalent series inductance of the decoupling capacitor can be upwards of 400 pH or more.

One problem with the conventional arrangement of a semiconductor package is that the impedance sensitivity of the power delivery network is affected by the total inductance experienced. For example, there is a strong resonance peak at around a frequency of one hundred megahertz caused by the total inductance experienced by the power delivery network. As the transistors in the IC begin switching, current needs to be supplied by the power delivery network. Because of the current flow through the impedance of the power delivery network, the power supply voltage can fluctuate, compromising stability of the power supplied to the ICs. Compromised stability can result in degraded operation of the IC.

Thus, there is a need for improved apparatuses and methods for reducing the total characteristic impedance in semiconductor packages.

SUMMARY

Example embodiments of the invention are directed to apparatuses, systems, methods, and computer-readable media for an interposer, in a chipset, for example. The interposer includes multilayer thin film capacitors incorporated therein to reduce parasitic inductance in the chipset. Power and ground terminals are disposed in a staggered pattern to cancel magnetic fields between conductive vias to reduce equivalent series inductance (ESL).

In one or more implementations, the interposer includes a plurality of multilayer thin film capacitors formed by a plurality of power and ground terminals disposed in a staggered pattern. The interposer also includes a plurality of conductive vias configured to couple the staggered pattern between a first set of contacts and a second set of contacts, wherein the first set of contacts has a smaller pitch than the second set of contacts. The plurality of multilayer thin film capacitors is disposed between the first set of contacts and the plurality of conductive vias.

The interposer may include a second plurality of multilayer thin film capacitors formed between the plurality of conductive vias and the second set of contacts. The plurality of multilayer thin film capacitors may be formed in a metal-insulator-metal (MIM) configuration. The plurality of multilayer thin film capacitors may include a plurality of trench capacitors. The interposer may be a Through Glass Via (TGV) interposer. The interposer may be a Through Silicon Via (TSV) interposer. The interposer may be a ceramic interposer. The interposer may be an organic interposer. The plurality of multilayer thin film capacitors may include a plurality of trench capacitors.

In one or more implementations, a system includes an interposer having a first side and a second side. The interposer includes a plurality of multilayer thin film capacitors formed by a plurality of power and ground terminals disposed in a staggered pattern. The interposer also includes a plurality of conductive vias configured to couple the staggered pattern between a first set of contacts and a second set of contacts. The system also includes a die disposed on the interposer.

The first set of contacts may have a smaller pitch than the second set of contacts. The plurality of multilayer thin film capacitors is disposed between the first set of contacts and the plurality of conductive vias. The system also may include a second plurality of multilayer thin film capacitors formed between the plurality of conductive vias and the second set of contacts. The plurality of multilayer thin film capacitors may be formed in a metal-insulator-metal (MIM) configuration. The plurality of multilayer thin film capacitors may include a plurality of trench capacitors. The die may be a flip-chip. The system may further include a substrate disposed on the second side of the interposer. The staggered pattern may be in at least one of a row-by-row and/or a column-by-column staggered pattern.

In one or more implementations, a method of making an interposer includes providing a plurality of power and ground terminals in a staggered pattern. The method also includes coupling a plurality of conductive vias to the plurality of power and ground terminals to form a plurality of multilayer thin film capacitors. The method further includes coupling the staggered pattern and the plurality of conductive vias between a first set of contacts and a second set of contacts.

The first set of contacts may have a smaller pitch than the second set of contacts. The plurality of multilayer thin film capacitors may be formed in a metal-insulator-metal (MIM) configuration. The staggered pattern may be a row-by-row and/or a column-by-column staggered pattern. The plurality of multilayer thin film capacitors may include a plurality of trench capacitors. The plurality of conductive vias may be Through Glass Vias (TGV) and/or Through Silicon Vias (TSV). Forming the plurality of conductive vias may be performed in a ceramic material, an organic material, a glass material, and/or silicon.

In one or more implementations, a computer-readable storage medium includes data that, when accessed by a machine, cause the machine to perform a method of making an interposer as described herein. The computer-readable storage medium may be non-transitory.

BRIEF DESCRIPTION OF THE DRAWINGS

The accompanying drawings are presented to aid in the description of embodiments of the invention and are provided solely for illustration of the embodiments and not limitation thereof.

FIG. 1A is a cross-sectional representation of a conventional IC package.

FIG. 1B is a schematic diagram of a simulated lumped circuit model for the IC package depicted in FIG. 1A.

FIG. 1C is a graphical representation of an impedance curve of a power delivery network impedance simulation according to one or more implementations of the technology described herein.

DETAILED DESCRIPTION

Figure 2:
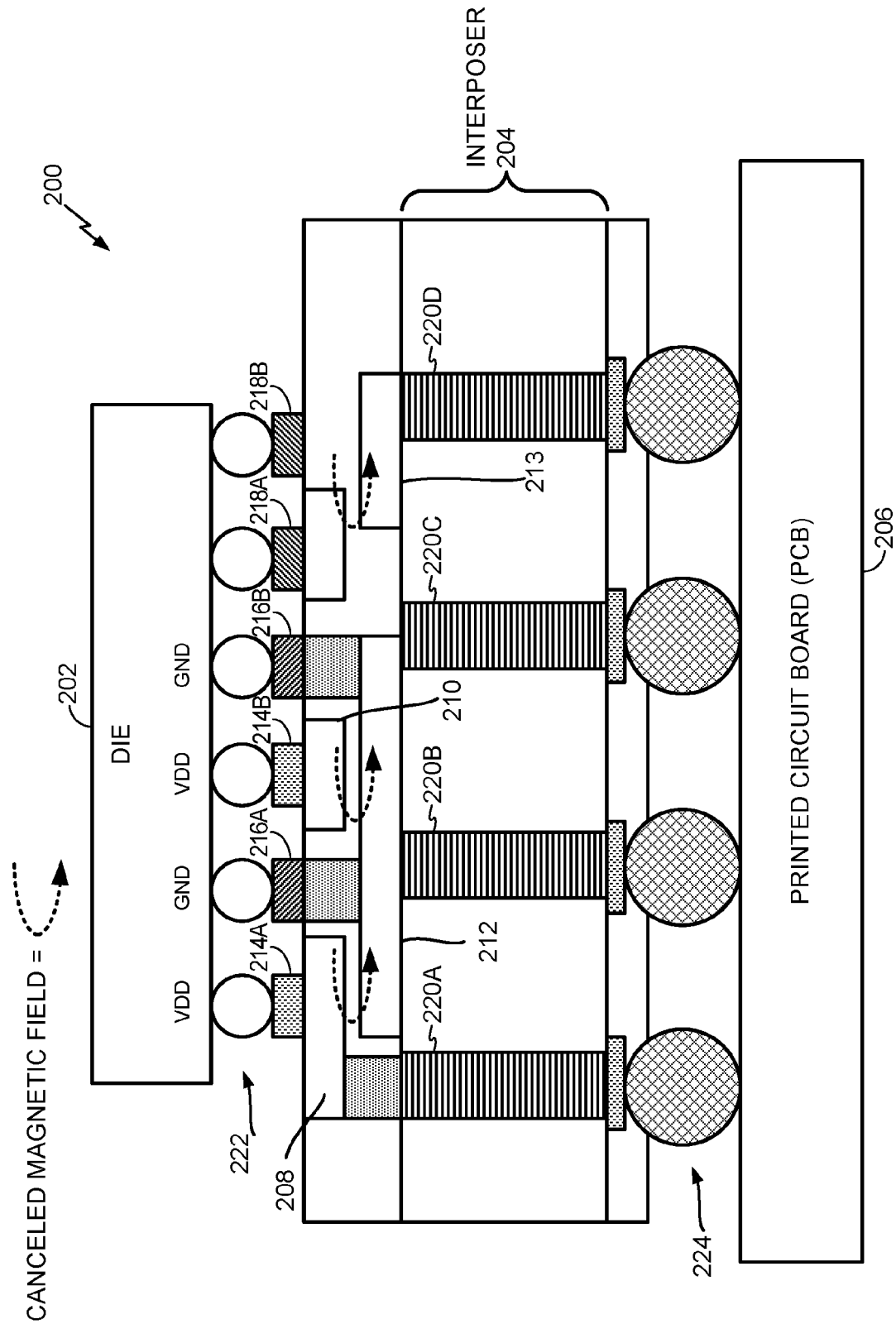
FIG. 2 shows a cross-sectional representation of an integrated circuit (IC) according to one or more implementations of the technology described herein.

In general, one implementation of the subject matter disclosed herein is directed to systems, methods, and apparatuses for reducing parasitic inductance and equivalent series inductance (ESL) in a semiconductor package. FIG. 1A is a cross-sectional representation of a conventional IC package 100. The illustrated IC package 100 includes a die 102 mounted to a package substrate 104 using a first set of contacts 106. A printed circuit board (PCB) 108 is mounted to the package substrate 104 using a second set of contacts 110. A bulk capacitor 112 is mounted to the PCB 108. A decoupling capacitor 114 is embedded in the package substrate 104. The die 102, package substrate 104, and PCB 108 are coupled together using a series of vias 116. The terms "contact" and "via" can both refer to structures for electrically connecting conductors/traces that are on different interconnect levels.

FIG. 1B is a schematic diagram of a simulated lumped circuit model 120 for the IC package 100. The illustrated lumped circuit model 120 shows the die 102 as a Mobile Station Modem (MSM) core coupled to a power management IC (PMIC) 122 using several resistances, capacitances, inductances, and a current source. The model 120 shows the MSM core 102 as having capacitance and resistance. The model 120 shows the package substrate 104 as having resistance and inductance. The model 120 also shows the package substrate 104 as having the decoupling capacitor 114 and a trace inductance of the traces 116. The model 120 shows the PMIC 122 as having inductance and resistance. The model 120 further shows the bulk capacitor 122, along with various other modeled resistances, capacitances, and inductances coupled between the package substrate 104 and the PMIC 122.

FIG. 1C is a graphical representation of an impedance curve 150 for a simulation of a power delivery network according to one or more implementations of the technology described herein. The illustrated impedance curve 150 plots a frequency response of the power delivery network on the x-axis with respect to impedance of the power delivery network (PDN) ($Z_{PDN}$) on the y-axis. The impedance of the power delivery network ($Z_{PDN}$) is simulated from the die 102 to the PMIC 122, including the capacitance from the bulk capacitor 112, the capacitance from the decoupling capacitor 114, and the trace inductance from the traces 116.

The illustrated impedance curve 150 includes a strong resonance peak 152, which may be due to the trace inductance of the decoupling capacitor 114 (i.e., parasitic inductance) combined with the equivalent series inductance (ESL) of the decoupling capacitor 114. Typically, this resonance peak occurs near 100 megahertz.

In one or more implementations, systems, methods, and apparatuses reduce parasitic inductance and equivalent series inductance (ESL). The result is that the resonance peak 152 is lowered to a level equivalent to the resonance peak 154.

FIG. 2 shows a cross-sectional representation of a system 200 according to one or more implementations of the technology described herein with which the resonance peak 152 can be lowered to the resonance peak 154. The system 200 illustrated in FIG. 2 depicts a chipset including a die 202 is disposed on an interposer 204. The interposer 204 is disposed on a printed circuit board (PCB) 206. The die 202 includes several power terminals (VDD) and ground terminals (GND). In one or more implementations, the die 102 is a flip-chip application processor. Of course, the die 102 can be any suitable functional semiconductor block.

In one or more implementations, the interposer 204 is implemented using through glass via (TGV) technology and/or through silicon via (TSV) technology. In one or more implementations, the interposer 204 is a ceramic interposer, a glass interposer, a silicon interposer, and/or an organic interposer.

The interposer 204 includes several metal lines and/or traces 208, 210, 212, and 213. The metal lines and/or traces 208 and 210 are coupled to several power terminals 214A and 214B, respectively. The metal lines and/or traces 212 and 213 are coupled to ground terminals 216A and 216B, respectively. The power terminals 214A and 214B and ground terminals 216A and 216B are disposed in a staggered pattern. The staggered pattern may be row-by-row, column-by-column, or the like. Several multilayer thin film capacitors are formed by the power terminals 214A and 214B and the ground terminals 216A and 216B. The power terminals 214A and 214B and ground terminals 216A and 216B are disposed in a staggered pattern. The metal lines and/or traces 208, 210, 212, and 213 thus also are disposed in a staggered pattern. The staggered pattern cancels the magnetic field that would have existed between the metal lines and/or traces conventionally. The staggered pattern may be row-by-row, column-by-column, or the like.

The interposer 204 also includes several terminals 218A and 218B that are configured to couple signals from the die 202 to the interposer 204 and the substrate 206. The interposer 204 also includes several conductive vias 220A, 220B, 220C, and 220D configured to couple the staggered pattern of power and ground terminals between a first set of contacts 222 and a second set of contacts 224.

In one implementation, the multilayer thin film capacitors may be formed in a metal-insulator-metal (MIM) configuration on one and/or both sides of the interposer. In this implementation, the multilayer thin film capacitors may be trench capacitors.

The metal lines in the MIM configuration can be aluminum (Al), copper (Cu), an alloy of Al and Cu, or other suitable conductors that provides signal paths for coupling or interconnecting electrical circuitry. Of course, in the case of non-MIM configurations, conductors other than metal are suitable. Materials such as doped polysilicon, doped single-crystal silicon, titanium (Ti), molybdenum (Mo), and refractory metal silicides are examples of other conductors.

The first set of contacts 222 is a ball grid array (BGA) disposed on the first side of the interposer 204. The second set of contacts 224 also is a BGA is disposed on the second side of the interposer 204. The BGA includes several solder bumps.

The first set of contacts 222 has a smaller pitch than the second set of contacts 224. For example, first set of contacts 222 may have a 100 micron pitch and the second set of contacts 224 may have a 400 micron pitch. In this manner, the interposer 204 can serve as a space transformer from the 100 micron pitch of the flip-chip BGA contacts 222 to the 400 micron pitch of the BGA contacts 224.

In one or more implementations, the multilayer thin film capacitors formed by the power terminals 214A and 214B and the ground terminals 216A and 216B reduce the peak 152 on the impedance curve 150 to the peak 154. This is accomplished by combining the multilayer thin film capacitors with the interposer to shorten the power loop from the die to the PMIC. That is, the interposer combined with the multilayer thin film capacitors causes the trace inductance (or parasitic inductance) from the flip-chip bump to the capacitor electrode (or via) to substantially be eliminated.

Recall that a conventional decoupling capacitor has magnetic fields generated between its electrodes. This is because typically the power and ground terminals are laid out in a checkerboard pattern. Laying out the power and ground terminals in a novel row-by-row and/or column-by-column staggered pattern rather than in a traditional checkerboard pattern reduces the equivalent series inductance (ESL) of an interposer designed according to the technology described herein because the row-by-row and/or column-by-column staggered pattern cancels the magnetic field that would normally be generated by conventional multilayer thin film capacitors.

Figure 3:
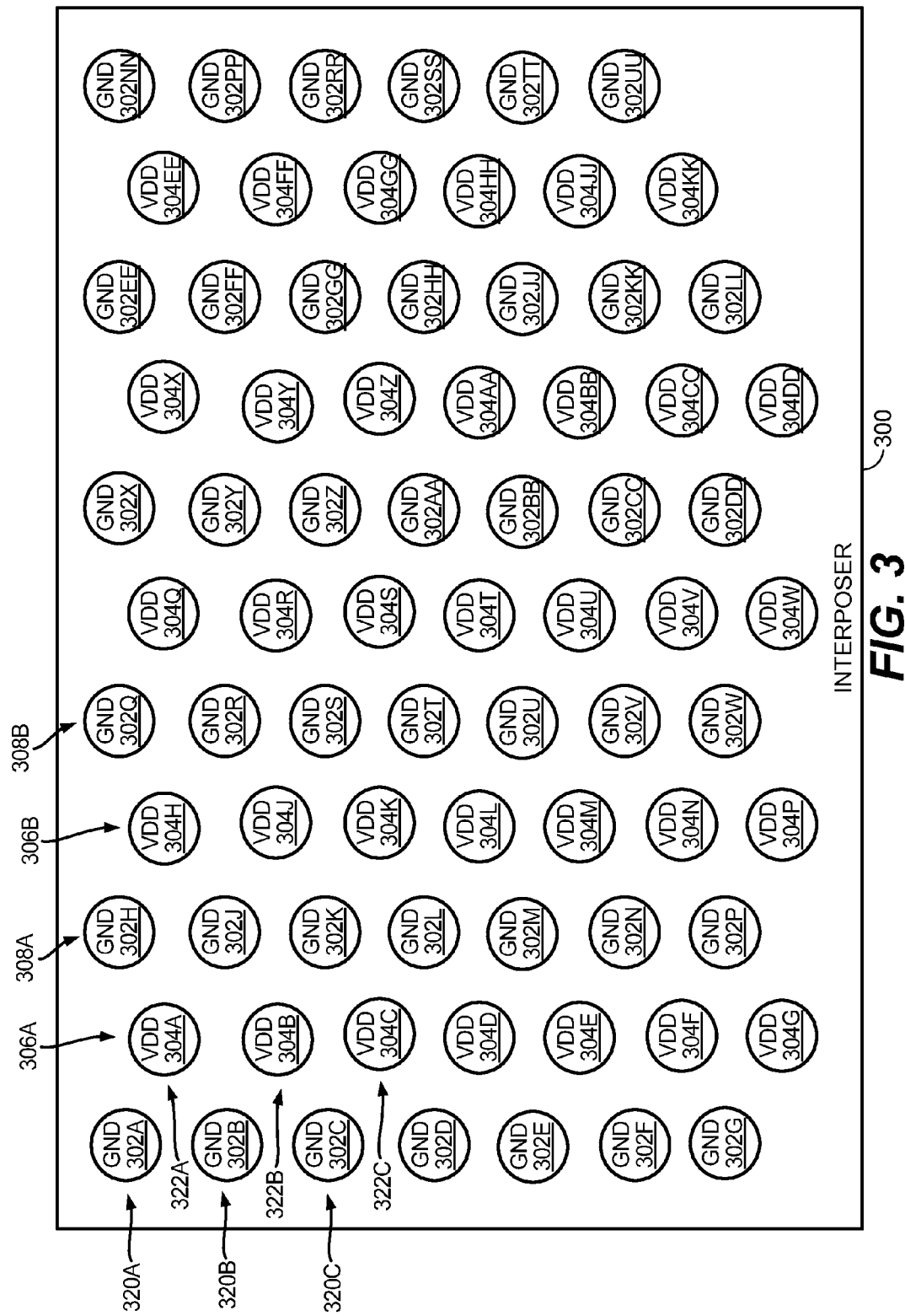
FIG. 3 illustrates a top plan view of an interposer having a staggered power and ground pattern according to one or more implementations of the technology described herein.

Recall further that according to implementations of the technology described herein the power terminals and ground terminals are disposed on an interposer in a row-by-row and/or column-by-column staggered pattern. FIG. 3 illustrates a top plan view of an interposer 300 having a row-by-row and/or column-by-column staggered power and ground pattern according to one or more implementations of the technology described herein. The illustrated interposer 300 includes several ground (GND) terminals 302A . . . ) and several power (VDD) terminals (304A . . . ) disposed on the interposer 300 in a staggered pattern. For example, a column 306A having power terminals 304A, 304B, 304C, 304D, 304E, 304F, and 304G is staggered from a column 308A having power terminals 302H, 302J, 302K, 302L, 302M, 302N, and 302P. That is, instead of having a conventional checkerboard pattern, the interposer 300 has the power and ground terminal columns and rows staggered row-by-row and/or column-by-column with respect to each other. For example, the power and ground planes in the interposer 300 alternate two-dimensionally in a staggered pattern.

Typically, laying out power and ground terminals in a checkerboard pattern in a decoupling capacitor causes the magnetic field to be generated between the electrodes in the decoupling capacitor. Laying out the power and ground terminals in a row-by-row and/or column-by-column staggered pattern rather than in a traditional checkerboard pattern reduces the equivalent series inductance (ESL) of the interposer 300 because the staggered pattern cancels the magnetic field that would normally be generated by conventional multilayer thin film capacitors.

In one example implementation, the interposer 300 can serve as a multilayer substrate (e.g., M1-M4). In this implementation, power and ground signals can be routed back to the BGA on the die.

In one example implementations, the interposer 300 includes six solder bumps (not shown) disposed on the set of power contacts and six solder bumps (not shown) disposed on the set of ground contacts. This results in twelve terminals and an ESL of approximately 70 pH because no magnetic field cancellation occurs. Alternatively, the interposer 300 includes twelve solder bumps (not shown) disposed on the set of power contacts and twelve solder bumps (not shown) disposed on the set of ground contacts. The power and ground contacts are staggered row-by-row and/or column-by-column. This results in twenty-four terminals and an ESL changes from a value of approximately 70 pH (six-by-six configuration) to a value of approximately 2 pH because magnetic field between the conductive vias is canceled.

In one or more implementations, the interposer 300 includes two rows of eighteen solder bumps (not shown) disposed on the set of power contacts and two rows of solder bumps (not shown) disposed on the set of ground contacts. The power and ground contacts are staggered row-by-row and/or column-by-column. This results in thirty-six terminals and an ESL changes from a value of approximately 70 pH (six-by-six configuration) to a value of approximately 1 pH because magnetic field between the conductive vias is canceled.

In one or more alternative implementations, the interposer 300 includes two rows of thirty-three solder bumps (not shown) disposed on the set of power contacts and two rows of forty solder bumps (not shown) disposed on the set of ground contacts. The power and ground contacts are staggered row-by-row and/or column-by-column. This results in seventy-three terminals and an ESL changes from a value of approximately 70 pH (six-by-six configuration) to a value of approximately 0.3 pH because magnetic field between the conductive vias is canceled.

For example, if the power and ground terminals form is plus and minus pattern, then there is counterclockwise magnetic field from the top of the interposer to the bottom of the interposer between the conductive vias. The next neighboring pair of conductive vias also has a counterclockwise magnetic field. Thus, if there is only a six-by-six configuration of power and ground terminals, then there may be no magnetic field cancelation.

Figure 4:
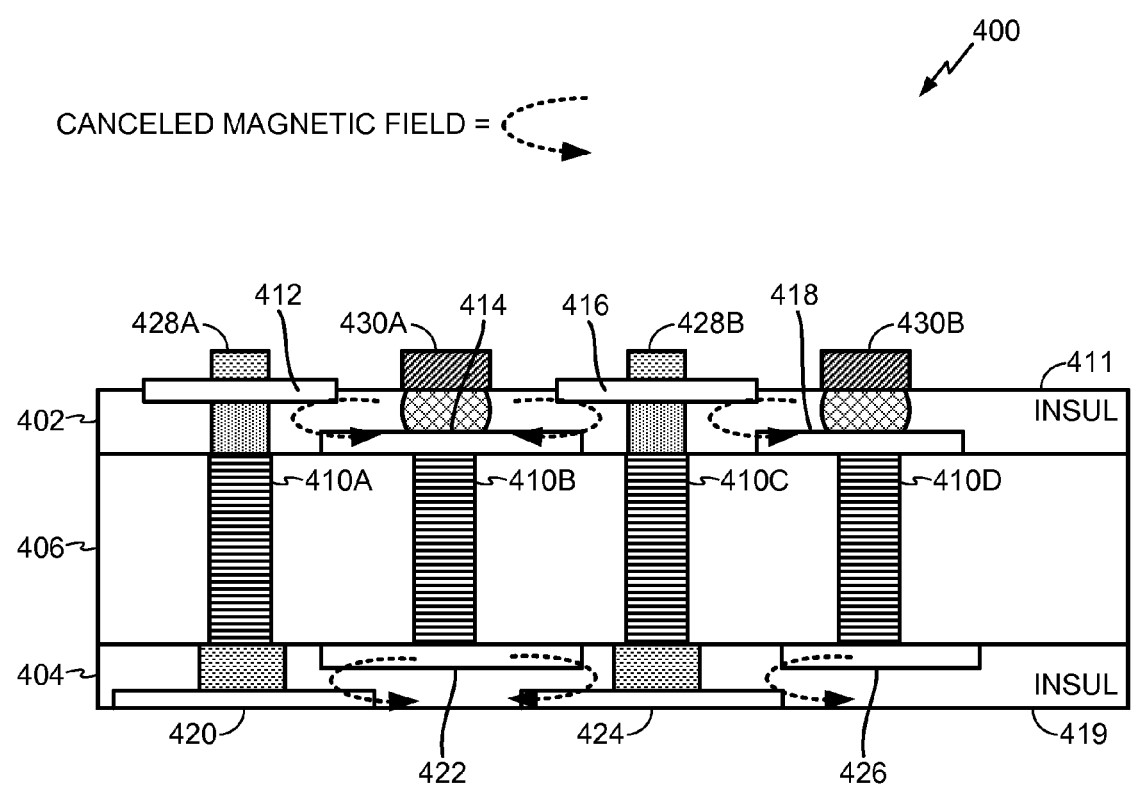
FIG. 4 shows a cross-sectional representation of an interposer having a staggered power and ground pattern according to one or more metal-in-metal (MIM) implementations of the technology described herein.

FIG. 4 shows a cross-sectional representation of an interposer 400 having a staggered power and ground pattern according to a double-sided MIM implementation of the technology described herein. The illustrated interposer 400 includes a MIM layer 402, a MIM layer 404, and an interposer 406 disposed between the MIM layer 402 and the MIM layer 404.

The illustrated interposer 406 includes several multilayer thin film capacitors formed by several conductive vias 410A, 410B, 410C, and 410D. Magnetic fields that would conventionally be present in a multilayer thin film capacitor are represented by the dotted arrows between the conductive vias 410A, 410B, 410C, and 410D are canceled using the configuration of the interposer 406.

The MIM layer 402 includes an insulating layer 411 having disposed therein several metal lines and/or traces 412, 414, 416, and 418. In one or more implementations, the insulating layer 411 can include an inorganic oxide and/or an inorganic nitride, such as silicon oxide, silicon nitride, tantalum oxide, strontium oxide, hafnium oxide, titanium oxide, zirconium oxide, aluminum oxide, or the like. Alternatively, the insulating layer can be organic insulators such as poly-imide, benzo chlorobutane (BCB), or the like. In one or more implementations, the metal traces 412, 414, 416, and 418 can include copper, a copper alloy, or other suitable material.

The MIM layer 404 includes an insulating layer 419 having disposed therein several metal lines and/or traces 420, 422, 424, and 426. In one or implementations, the insulating layer 411 can include an inorganic oxide and/or an inorganic nitride, such as silicon oxide, silicon nitride, tantalum oxide, strontium oxide, hafnium oxide, titanium oxide, zirconium oxide, aluminum oxide, or the like. Alternatively, the insulating layer can be organic insulators such as poly-imide, benzo chlorobutane (BCB), or the like. In one or more implementations, the metal traces 412, 414, 416, and 418 can include copper, a copper alloy, or other suitable material.

A surface of the illustrated MIM layer 402 includes several power terminals 428A and 428B and several ground terminals 430A and 430B. According to implementations of the technology described herein the power terminals 428A and 428B and the ground terminals 430A and 430B are disposed on the interposer 400 in a row-by-row and/or column-by-column staggered pattern. Laying out the power and ground terminals in a row-by-row and/or column-by-column staggered pattern rather than in a traditional checkerboard pattern reduces the equivalent series inductance (ESL) of the interposer 400 because the staggered pattern cancels the magnetic field that would normally be generated by conventional multilayer thin film capacitors.

Figure 5:
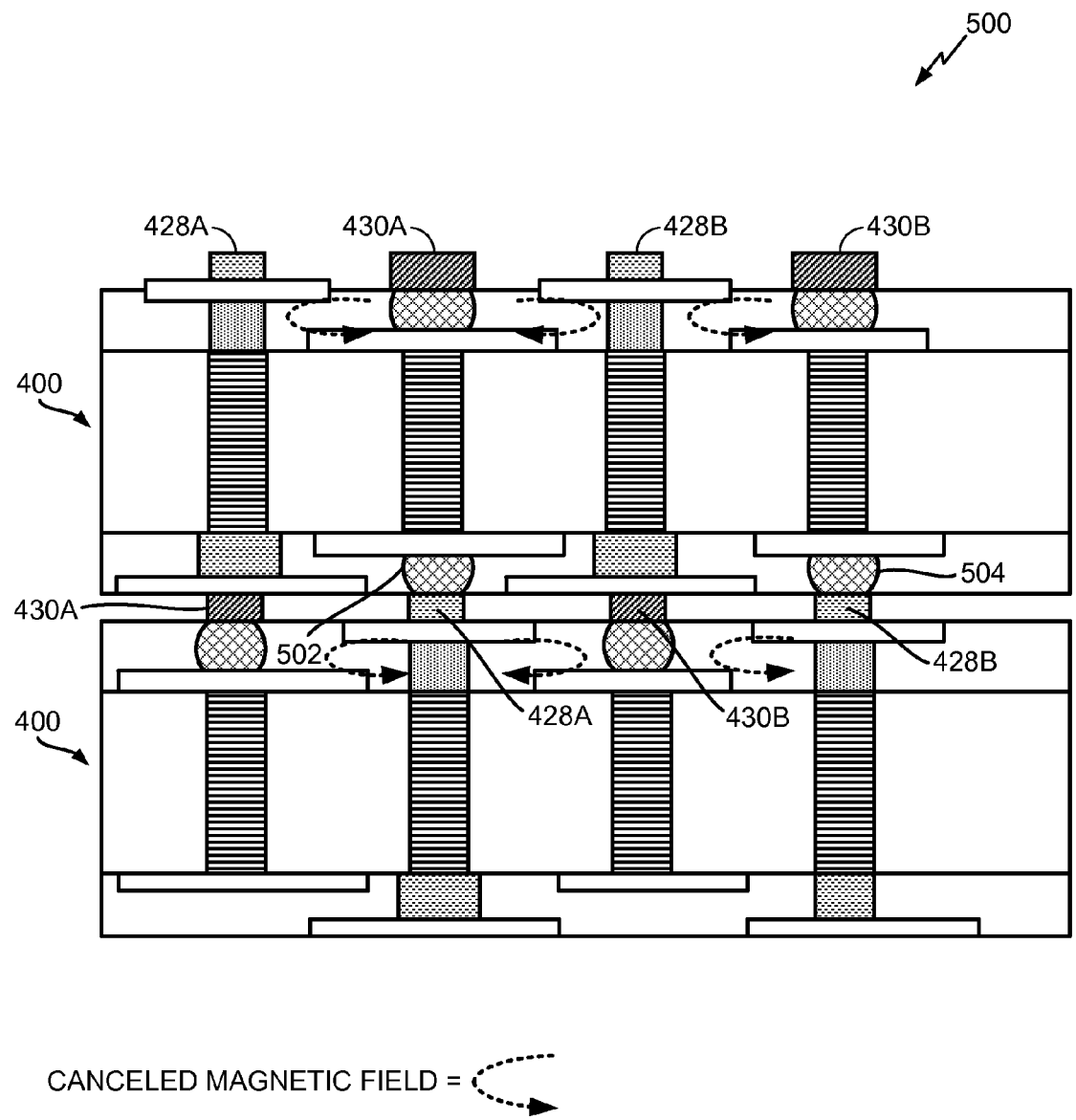
FIG. 5 shows a cross-sectional representation of a two-layer interposer according to one or more metal-in-metal (MIM) implementations of the technology described herein.

FIG. 5 shows a cross-sectional representation of an interposer 500 having a staggered power and ground pattern according to an implementation of the technology described herein. The interposer 500 includes the two interposers 400 disposed together using a solder bump 502 and a solder bump 504. The two interposers 400 are shifted such that the power terminals 428A and 428B correspond to ground terminals 430A and 430B, respectively. As with the single layer interposer 400, the two-layer interposer 500 has its power terminals 428A and 428B and the ground terminals 430A and 430B are disposed in a row-by-row and/or column-by-column staggered pattern. Laying out the power and ground terminals in a row-by-row and/or column-by-column staggered pattern rather than in a traditional checkerboard pattern reduces the equivalent series inductance (ESL) of the interposer 500 because the staggered pattern cancels the magnetic field that would normally be generated by conventional multilayer thin film capacitors.

Figure 6:
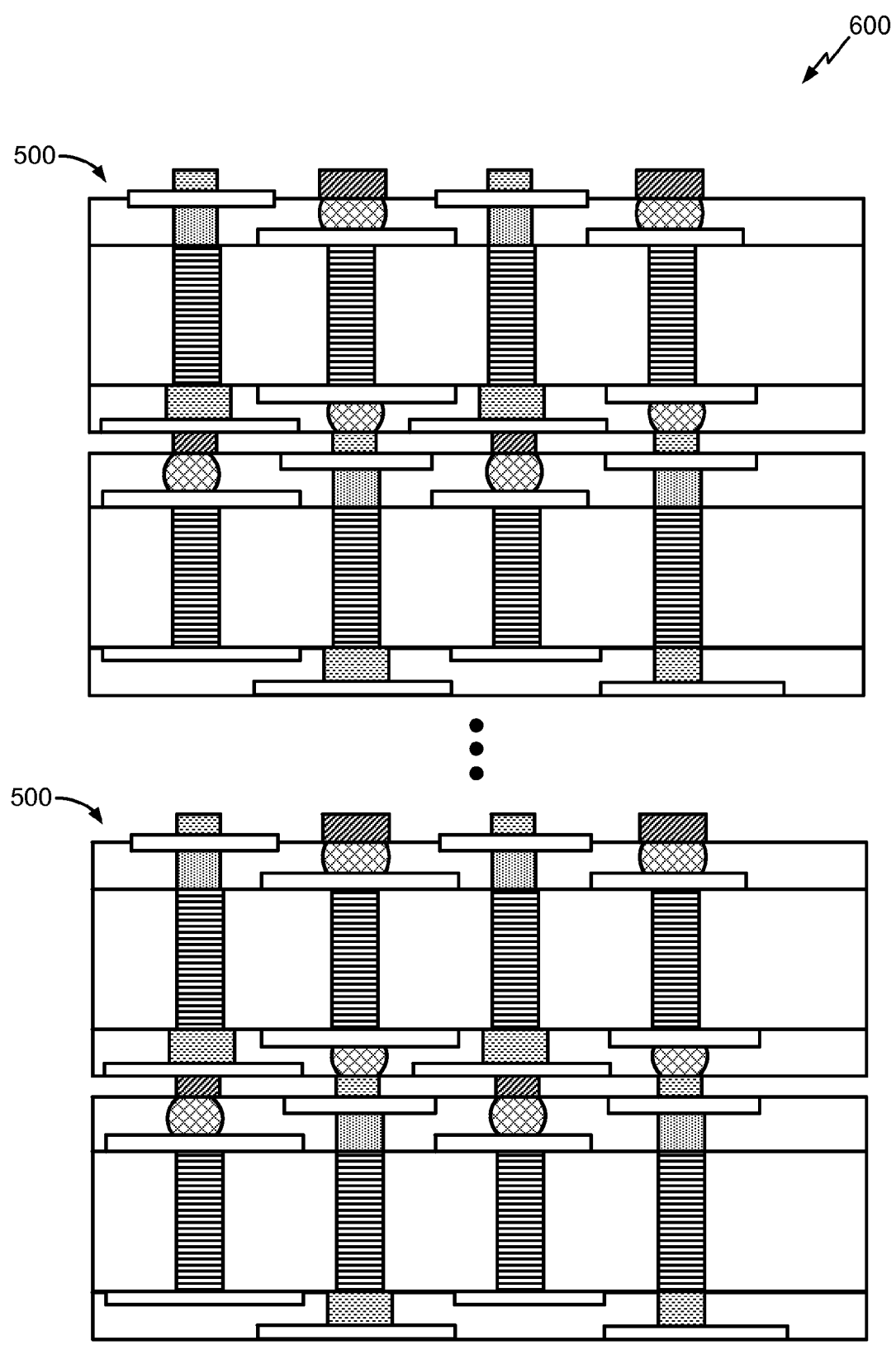
FIG. 6 shows a cross-sectional representation of a multi-layer interposer according to one or more metal-in-metal (MIM) implementations of the technology described herein.

FIG. 6 shows a cross-sectional representation of a multilayer interposer 600 according to an implementation of the technology described herein. The illustrated interposer 600 includes several of the interposers 500 having a staggered power and ground pattern disposed on each other. As with the interposer 500, interposer 600 has its power and ground terminals disposed in a row-by-row and/or column-by-column staggered pattern. Laying out the power and ground terminals in a row-by-row and/or column-by-column staggered pattern rather than in a traditional checkerboard pattern reduces the equivalent series inductance (ESL) of the interposer 600 because the staggered pattern cancels the magnetic field that would normally be generated by conventional multilayer thin film capacitors.

Figure 7:
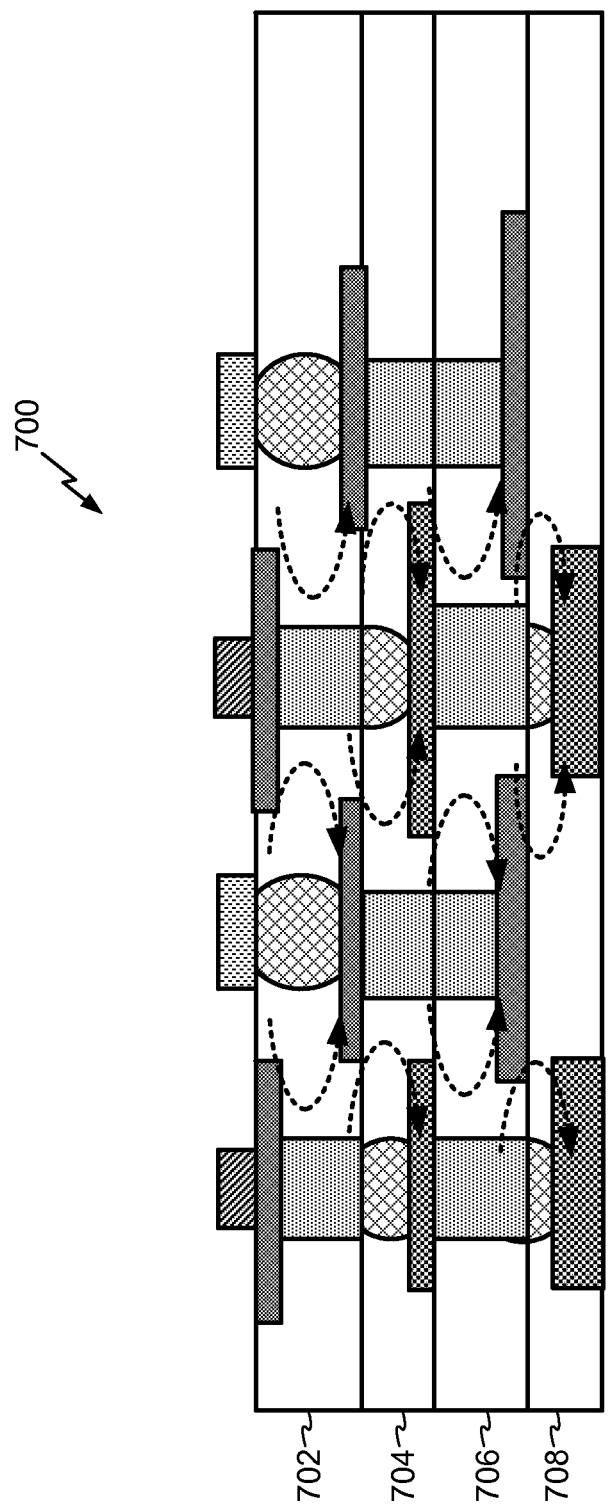
FIG. 7 shows a cross-sectional representation of an interposer according to one or more implementations of the technology described herein.

FIG. 7 shows a cross-sectional representation of a multilayer interposer 700 according to an implementation of the technology described herein in which the capacitance of the thin film capacitors can be doubled, quadrupled, etc. In the illustrated implementation, the multilayer interposer 700 is a thin film version of the interposer 600 depicted in FIG. 6. For example, the multilayer interposer 700 includes four layers 702, 704, 706, and 708. As with the interposer 600, the interposer 700 has its power and ground terminals disposed in a row-by-row and/or column-by-column staggered pattern. Laying out the power and ground terminals in a row-by-row and/or column-by-column staggered pattern rather than in a traditional checkerboard pattern reduces the equivalent series inductance (ESL) of the interposer 700 because the staggered pattern cancels the magnetic field that would normally be generated by conventional multilayer thin film capacitors.

Figure 8:
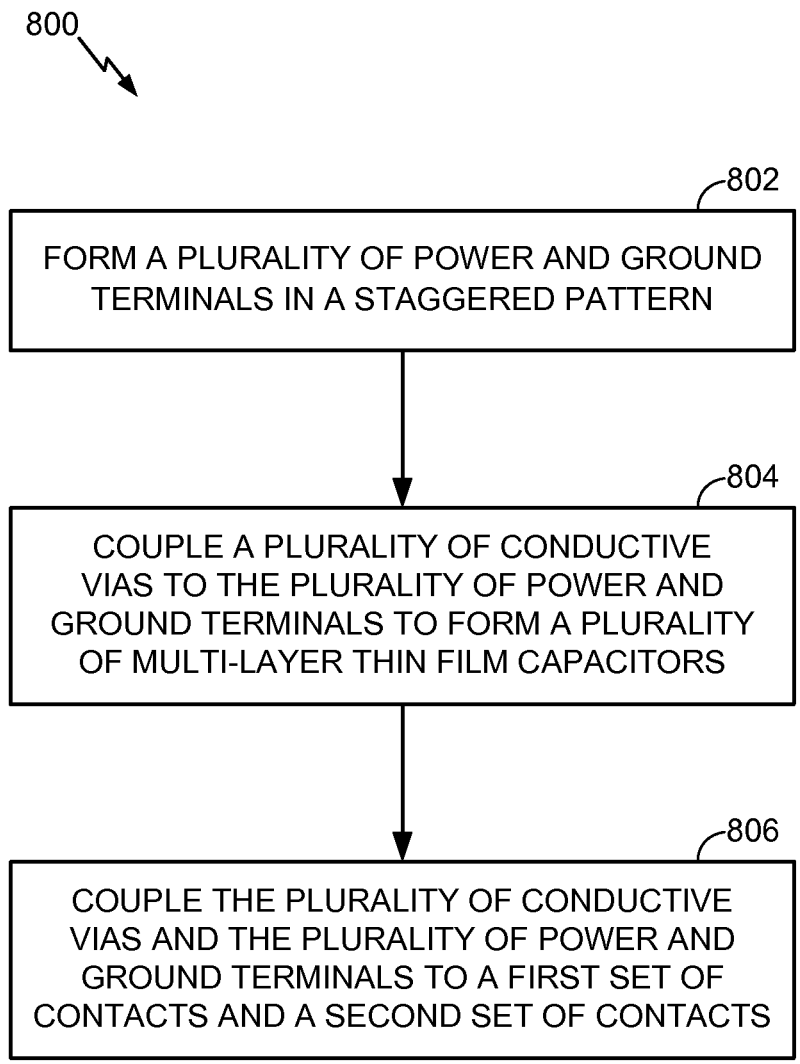
FIG. 8 is a flowchart illustrating a method of making an interposer according to implementations described herein.

FIG. 8 is a flowchart illustrating a method 800 of making an interposer according to implementations described herein. In a block 802, the method 800 operates by providing a plurality of power and ground terminals in a staggered pattern. In a block 804, the method 800 operates by coupling a plurality of conductive vias to the plurality of power and ground terminals to form a plurality of multilayer thin film capacitors. In a block 806, the method 800 operates by coupling the staggered pattern of power and ground terminals and the plurality of conductive vias between a first set of contacts and a second set of contacts.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage, or mode of operation.

The terminology used herein is for the purpose of describing particular embodiments only and is not intended to be limiting of embodiments of the invention. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific ICs (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences, and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer-readable media embodying a method for low package parasitic inductance using a thru-substrate interposer. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps, and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A structure including an interposer having a first side, a second side opposite the first side, a third side, a fourth side opposite the third side, a fifth side, and a sixth side opposite the fifth side, the structure comprising: a plurality of multilayer thin film capacitors comprising a plurality of power and ground terminals disposed in a staggered pattern of rows and columns relative to the third side and the fourth side and relative to the fifth side and the sixth side; and
a plurality of conductive vias configured to couple to the staggered pattern between a first set of contacts and a second set of contacts.

2. The structure of claim 1, wherein the first set of contacts has a smaller pitch than the second set of contacts.

3. The structure of claim 2, wherein the plurality of multilayer thin film capacitors are disposed between the first set of contacts and the plurality of conductive vias.

4. The structure of claim 3, further comprising a second plurality of multilayer thin film capacitors formed between the plurality of conductive vias and the second set of contacts.

5. The structure of claim 1, wherein the plurality of multilayer thin film capacitors are formed in a metal-insulator-metal (MIM) configuration.

6. The structure of claim 5, wherein the plurality of multilayer thin film capacitors includes a plurality of trench capacitors.

7. The structure of claim 1, wherein the interposer is a Through Glass Via (TGV) interposer.

8. The structure of claim 1, wherein the interposer is a Through Silicon Via (TSV) interposer.

9. The structure of claim 1, wherein the interposer is a ceramic interposer.

10. The structure of claim 1, wherein the interposer is an organic interposer.

11. The structure of claim 1, wherein the plurality of multilayer thin film capacitors includes a plurality of trench capacitors.

* * * * *